(12) United States Patent
Anzou et al.

(10) Patent No.: US 8,176,372 B2
(45) Date of Patent: May 8, 2012

(54) SEMICONDUCTOR INTEGRATED CIRCUIT

(75) Inventors: Kenichi Anzou, Tokyo (JP); Chikako Tokunaga, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 236 days.

(21) Appl. No.: 12/404,178

(22) Filed: Mar. 13, 2009

(65) Prior Publication Data

US 2009/0245000 A1 Oct. 1, 2009

(30) Foreign Application Priority Data

Mar. 31, 2008 (JP) ................................ 2008-093254

(51) Int. Cl.
*G11C 29/00* (2006.01)

(52) U.S. Cl. ........ 714/719; 714/718; 714/720; 365/200; 365/201

(58) Field of Classification Search .......... 714/718–720; 365/200, 201
See application file for complete search history.

(56) References Cited

U.S. PATENT DOCUMENTS

| | | | |
|---|---|---|---|
| 4,969,148 A | 11/1990 | Nadeau-Dostie et al. | |
| 5,423,028 A * | 6/1995 | Schieve et al. | 714/42 |
| 5,784,323 A * | 7/1998 | Adams et al. | 365/201 |
| 6,496,950 B1 * | 12/2002 | Zhao et al. | 714/718 |
| 6,550,034 B1 * | 4/2003 | Riedlinger et al. | 714/733 |
| 6,563,751 B1 * | 5/2003 | Wu | 365/201 |
| 6,603,691 B2 * | 8/2003 | Yoo et al. | 365/201 |
| 7,020,811 B2 * | 3/2006 | Byrd | 714/703 |
| 7,139,946 B2 * | 11/2006 | Nadeau-Dostie et al. | 714/720 |
| 7,266,735 B2 | 9/2007 | Hirabayashi | |
| 7,434,131 B2 * | 10/2008 | Mukherjee et al. | 714/733 |
| 2001/0052090 A1 | 12/2001 | Mio | |
| 2007/0011535 A1 | 1/2007 | Anzou et al. | |

FOREIGN PATENT DOCUMENTS

| | | |
|---|---|---|
| JP | 01-297746 | 11/1989 |
| JP | 2001-035153 | 2/2001 |
| JP | 2006-004476 | 1/2006 |
| JP | 2008-016156 | 1/2008 |

OTHER PUBLICATIONS

Turki et al., A Distributed BIST Architecture Enabling Extended Sharing and Debug Capabilities. 2006, IEEE, pp. 1-5.*
Hamdioui et al., BIST Enhancement for Detecting Bit/Byte Write Enable Faults in SOC SRAMs, 2008, IEEE, pp. 1-6.*
Adham et al., A BIST Algorithm for Bit/Group Write Enable Faults in SRAMs, 2004, IEEE, pp. 1-4.*
Partial Translation of JP 1-297746 A. Performed Jan. 27, 2011.*
Paul H. Bardell et al., "Built-In Test for VLSI: Pseudorandom Techniques," 1987, A Wiley-Interscience Publication, pp. 109-114.
U.S. Appl. No. 12/345,298.
Notice of Rejection mailed by Japan Patent Office on May 11, 2010 in the corresponding Japanese patent application No. 2008-093254.

* cited by examiner

Primary Examiner — John J Tabone, Jr.

(74) Attorney, Agent, or Firm — Knobbe Martens Olson & Bear, LLP

(57) ABSTRACT

A one-hot data generating unit generates one-hot data for the maximum data bit width in which a state of one bit is exclusively inverted with respect to states of other bits while sequentially shifting a bit position to be inverted, and writes the one-hot data in an area of a memory designated by an address. A short defect between wirings connected to the memory is detected by comparing the one-hot data written in the memory with the one-hot data before being written.

11 Claims, 9 Drawing Sheets

FIG.7
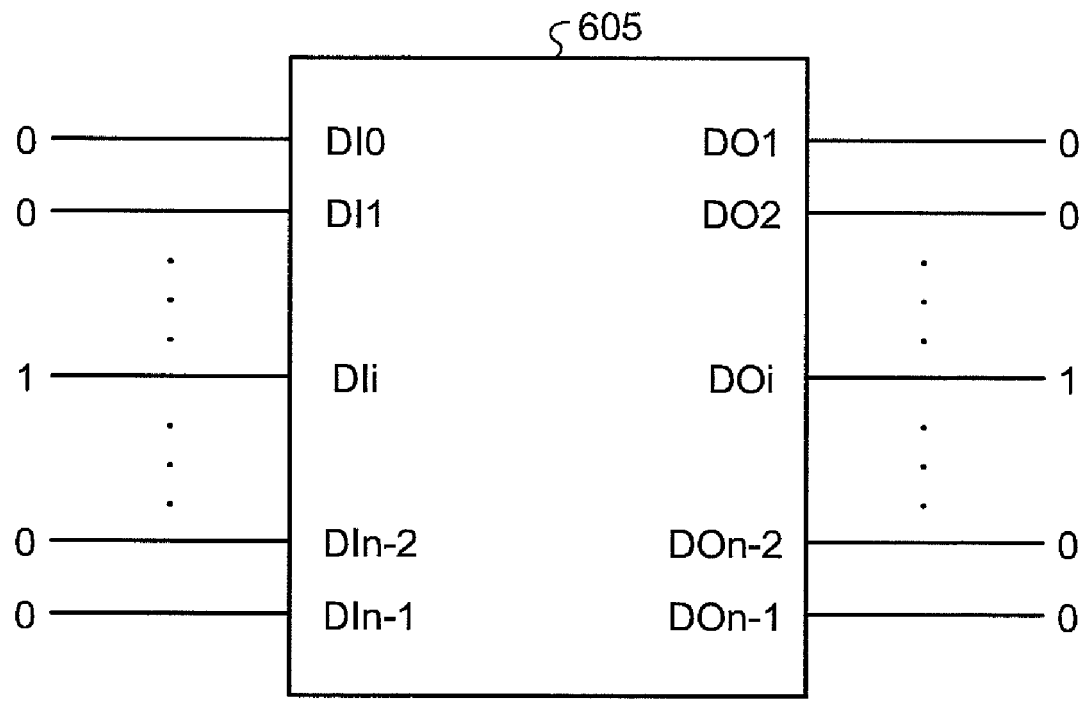
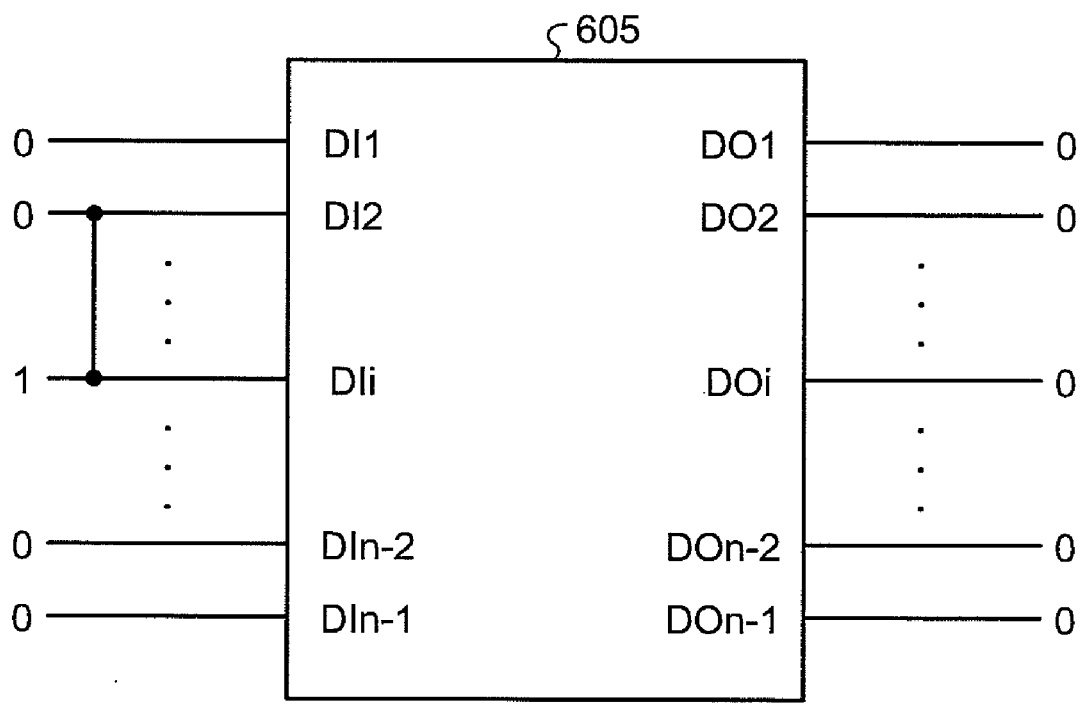

SEMICONDUCTOR INTEGRATED CIRCUIT

CROSS-REFERENCE TO RELATED APPLICATIONS

This application is based upon and claims the benefit of priority from the prior Japanese Patent Application No. 2008-93254, filed on Mar. 31, 2008; the entire contents of which are incorporated herein by reference.

BACKGROUND OF THE INVENTION

1. Field of the Invention

The present invention relates to a semiconductor integrated circuit, and more particularly, to a semiconductor integrated circuit having a built-in self-test (BIST) circuit.

2. Description of the Related Art

One of the methods of performing a manufacturing test of a semiconductor integrated circuit having an embedded memory is to incorporate a built-in self-test circuit in the semiconductor integrated circuit and to perform a test of the memory device by using the self-test circuit. This built-in self testing method includes a comparator-type BIST and a compactor-type BIST. In the comparator-type BIST, a comparison between written data and read data with respect to a memory device is performed in the semiconductor integrated circuit, and the manufacturing test is performed by investigating whether the written data and the read data match with each other. On the other hand, in the compactor-type BIST, read data that is read from a memory device is compacted in the semiconductor integrated circuit, and the resultant compacted data is sent to a tester. Then, the manufacturing test is performed by comparing the compacted data with an expected value that is calculated in advance as a test result. In this case, a multiple input signature register (MISR), which is a modified version of a linear feedback shift register (LSFR), is generally used, as described in Paul H. Bardell, William H. McAnney, and Jacob Savir, "Built-in Test for VLSI: Pseudo Random Techniques, John Wiley&Sons, 1987.

In general, a test algorithm for a manufacturing test of a memory is developed in such a manner that a certain level of defect in a basic peripheral circuit, such as an address decoder and an input/output (I/O) circuit, can be detected as well as a cell array in a memory device, as in the case of a marching test.

However, for a circuit of an additional function other than such basic peripheral circuits, it is often the case that a detection of a defect in the circuit is unconsidered. For example, for a bit write enable circuit that controls a data write to a memory for each bit, a test is usually executed by setting the function to an enabled state in many cases in the marching test and the like, so that the function of the bit write enable circuit itself is not thoroughly tested.

In addition, a data pattern used in the test algorithm for the manufacturing test of the memory is generally a regular pattern such as a pattern in which all bits are "0"s or "1"s and a checkerboard pattern. For this reason, a data pattern applied to an input of a memory device is sometimes generated from the minimal data register in a BIST circuit to suppress a circuit size.

In this case, between even-numbered bit inputs of the memory device, for example, it is only possible to take a state of the same signal value because the data pattern is supplied from the same data register. Meanwhile, on a semiconductor integrated circuit, physical wirings connected to input terminals of a memory device, which is not adjacent to each other, may be passed around and placed adjacent to each other on the semiconductor integrated circuit, so that some even-numbered inputs may be adjacent to each other on the wiring. For this reason, in the case where a state can be only obtained with the same signal values during a test, even if a short defect occurs between wirings to be connected to even-numbered bit inputs, it is not possible to detect the short defect between the even-numbered bit inputs.

To cope with the above problem, a method is disclosed in U.S. Pat. No. 4,969,148 in which a switching circuit that switches an output of a memory device from a bit to an input of an adjacent bit is provided to build a test circuit such that a data input for a test is applied to the first one bit only. In this method, because the data of the memory is rewritten for each bit during the test, a reverse signal value is surely taken between arbitrary two bits, which makes it possible to detect a short defect between the wirings.

However, in the method disclosed in U.S. Pat. No. 4,969,148, at the time of performing a marching test, for example, because a test is performed in units of bit, instead of typical units of word, as many times as the number of addresses, the test time is increased as long as the multiple of the maximum number of bits.

BRIEF SUMMARY OF THE INVENTION

A semiconductor integrated circuit according to an embodiment of the present invention comprises: a data generating unit that generates a data pattern to be input to a data input of the memory; an address generating unit that generates an address of the memory to which the data pattern is to be input; a control-signal generating unit that generates a control signal for controlling read and write of data with respect to the memory; and a one-hot data generating unit that generates one-hot data for a predetermined bit width in which a state of one bit is exclusively inverted with respect to states of other bits, and sequentially inputs the one-hot data to the data input of the memory, while sequentially shifting a bit position to be inverted.

A semiconductor integrated circuit according to an embodiment of the present invention comprises: a memory collar that includes a memory to be tested and a logical element necessary for a test operation of the memory; a data generating unit that generates a data pattern to be input to a data input of the memory; and a one-hot data generating unit that generates one-hot data for a predetermined bit width in which a state of one bit is exclusively inverted with respect to states of other bits while sequentially shifting a bit position to be inverted, and sequentially inputs the one-hot data to a bit write enable input of the memory, while sequentially shifting a bit position to be inverted.

A semiconductor integrated circuit according to an embodiment of the present invention comprises: a memory collar that includes a memory to be tested and a logical element necessary for a test operation of the memory; a data generating unit that generates a data pattern to be applied to a data input of the memory; and a one-hot data generating unit that generates one-hot data for a predetermined bit width in which a state of one bit is exclusively inverted with respect to states of other bits while sequentially shifting a bit position to be inverted, and sequentially applies the one-hot data to a data input of the memory while inhibiting the data pattern generated by the data generating unit from being sequentially input to the data input of the memory.

BRIEF DESCRIPTION OF THE DRAWINGS

FIG. 7 is a schematic diagram illustrating a change of read data due to a short defect between wirings in the semiconductor integrated circuit according to the fourth embodiment;

DETAILED DESCRIPTION OF THE INVENTION

Exemplary embodiments of a semiconductor integrated circuit according to the present invention will be explained in detail below with reference to the accompanying drawings. However, the present invention is not to be considered limited to the embodiments.

Figure 1:
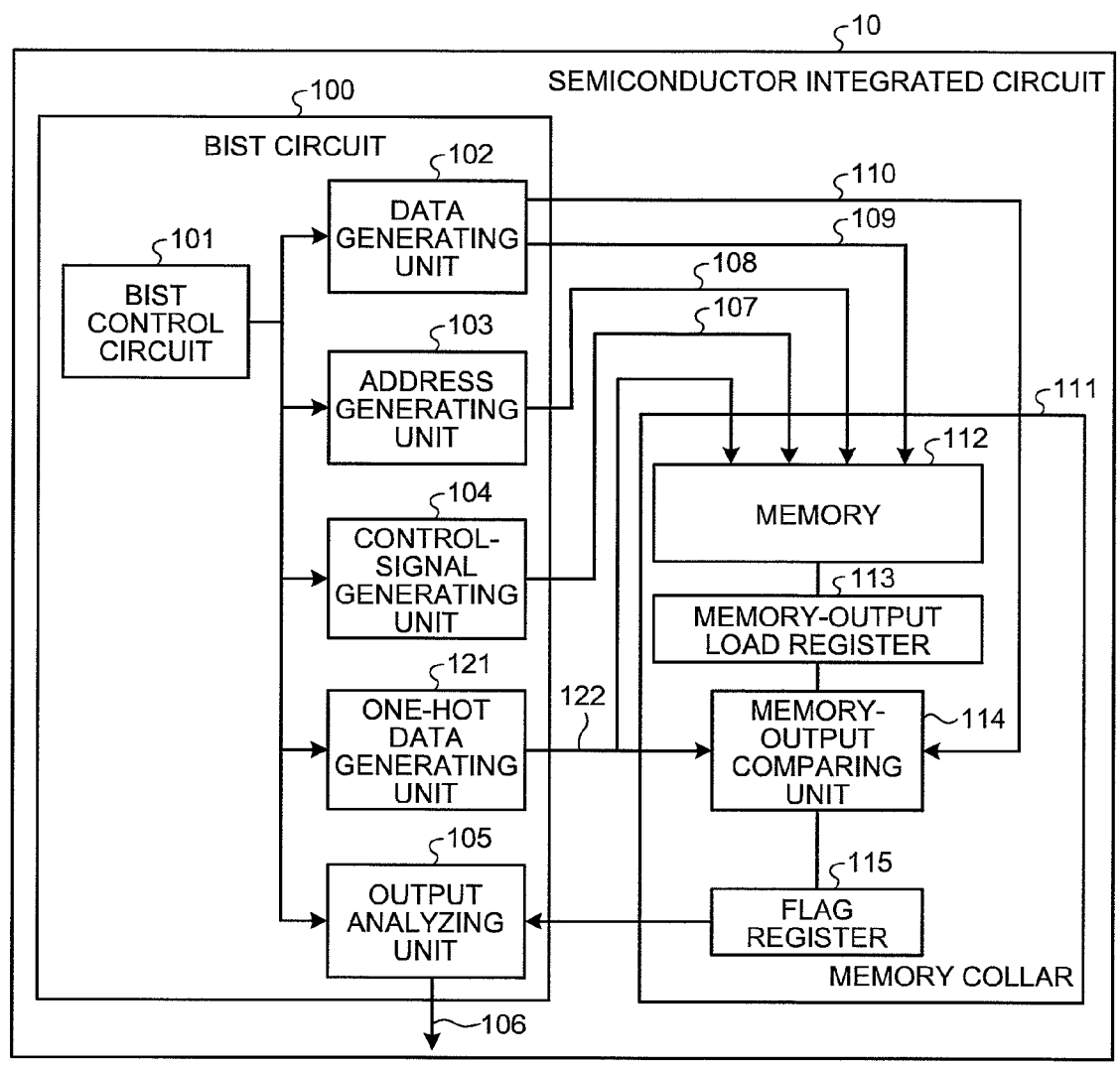
FIG. 1 is a block diagram of a semiconductor integrated circuit according to a first embodiment of the present invention.

FIG. 1 is a block diagram of a semiconductor integrated circuit 10 according to a first embodiment of the present invention.

The semiconductor integrated circuit 10 is formed on a semiconductor chip. As shown in FIG. 1, in the semiconductor integrated circuit 10, a memory collar 111 in which various logical elements necessary for a test operation and a memory 112 are formed and a BIST circuit 100 that tests the memory 112 is incorporated.

The BIST circuit 100 includes a BIST control circuit 101, a data generating unit 102, an address generating unit 103, a control-signal generating unit 104, an output analyzing unit 105, and a one-hot data generating unit 121. The BIST control circuit 101 performs an overall control of the BIST circuit 100; the data generating unit 102 generates a data pattern 109 to be applied to a data input of the memory 112 and an output expected value 110; the address generating unit generates an address 108 of the memory 112 to which the data pattern 109 is applied; the control-signal generating unit 104 generates a control signal 107 for controlling read and write of data with respect to the memory 112; the output analyzing unit 105 generates a BIST result 106 based on a flag output from a flag register 115; and the one-hot data generating unit 121 generates one-hot data 122 to be applied to an input of the memory 112.

In the control signal 107, a read enable signal, a write enable signal, a chip enable signal, and the like can be included. The one-hot data 122 can be configured with data for a width of the maximum data bits in which only a state of one bit is inverted with respect to the states of the other bits while sequentially shifting a bit position to be inverted. For example, if the width of the maximum data bits is 8 bits, the one-hot data 122 can be configured with following bit sequences.

(10000000)
(01000000)
(00100000)
(00010000)
(00001000)
(00000100)
(00000010)
(00000001)

The memory collar 111 includes the memory 112, a memory-output capture register 113, a memory-output comparing unit 114, and the flag register 115. The memory 112 stores therein data; the memory-output capture register 113 stores therein read data that is read from the memory 112; the memory-output comparing unit 114 compares the read data from the memory 112 with the output expected value 110 output from the data generating unit 102; and the flag register 115 stores therein a comparison result from the memory-output comparing unit 114.

The same data as the data pattern 109 that is to be applied to the data input of the memory 112 can be used as the output expected value 110.

When performing a failure detection for a cell array, an address decoder, an input/output (I/O) circuit, and the like in the memory 112, the BIST control circuit 101 controls the data generating unit 102, the address generating unit 103, and the control-signal generating unit 104, to sequentially generate signals required to test the memory 112. The data pattern 109 generated by the data generating unit 102 is applied to the data input of the memory 112; the address 108 generated by the address generating unit 103 is applied to an address input of the memory 112; the control signal 107 generated by the control-signal generating unit 104 is applied to a control input of the memory 112; and as a result, the data pattern 109 is written in an area designated by the address 108.

When the data pattern 109 is written in the memory 112, the BIST control circuit 101 controls the address generating unit 103 and the control-signal generating unit 104, to read out the data pattern 109 that is written in the memory 112 and output the output expected value 110 generated by the data generating unit 102 to the memory-output comparing unit 114. When the data pattern 109 written in the memory 112 is read out, the read data is once stored in the memory-output capture register 113, and then output to the memory-output comparing unit 114. An output from the memory-output capture register 113 and the output expected value 110 are compared with each other in the memory-output comparing unit 114, and the comparison result obtained thus is stored in the flag register 115.

A flag output from the flag register 115 is input to the output analyzing unit 105, and as the output analyzing unit 105 analyzes the flag output, the BIST result 106 is output. In the case of testing a plurality of memories with a single unit of the BIST circuit 100, the flag output of each of the memories is input to the output analyzing unit 105, and then the BIST result 106 is output after performing the pass/fail decision of the whole memory tests.

Meanwhile, in the case of detecting a short defect between wirings connected to the memory 112, the BIST control circuit 101 controls the address generating unit 103, the control-signal generating unit 104, and the one-hot data generating unit 121, to sequentially generate signals required to detect the short defect between the wirings. The one-hot data 122 generated by the one-hot data generating unit 121 is applied to the data input of the memory 112; the address 108 generated by the address generating unit 103 is applied to an address input of the memory 112; the control signal 107 generated by the control-signal generating unit 104 is applied to a control input of the memory 112; and as a result, the one-hot data 122 is written in an area designated by the address 108.

When the one-hot data 122 is written in the memory 112, the BIST control circuit 101 controls the address generating unit 103 and the control-signal generating unit 104, to read out the one-hot data 122 that is written in the memory 112 and output the one-hot data 122 generated by the one-hot data generating unit 121 to the memory-output comparing unit 114. When the one-hot data 122 written in the memory 112 is read out, the read data is once stored in the memory-output capture register 113, and then output to the memory-output comparing unit 114. An output from the memory-output capture register 113 and the one-hot data 122 are compared with each other in the memory-output comparing unit 114, and the comparison result obtained thus is stored in the flag register 115.

In this manner, it is possible to make only the state of a wiring for each one bit connected to the memory 112 sequentially different from the states of wirings of the other bits by sequentially applying the one-hot data 122 to the data input of the memory 112. Therefore, even when the same data register is shared among even-numbered bit inputs or the same data register is shared among odd-numbered bit inputs, the states among the even-numbered bit inputs or the states among the odd-numbered bit inputs can be different from each other with the address 108 fixed, and thus, the short defect among the even-numbered bit inputs or the short defect among the odd-numbered bit inputs can be detected. As a result, it is possible to detect the short defect among the even-numbered bit inputs or the short defect among the odd-numbered bit inputs while suppressing an increase of the circuit scale. In addition, because it is not necessary to perform the test as many times as the number of addresses to detect such a short defect, it is possible to suppress an increase of the test time.

In the case of testing a function of a bit write enable circuit of the memory 112, the BIST control circuit 101 controls the data generating unit 102, the address generating unit 103, the control-signal generating unit 104, and the one-hot data generating unit 121, to sequentially generate signals required to detect a fault in the bit write enable circuit. The data pattern 109 generated by the data generating unit 102 is applied to the data input of the memory 112; the address 108 generated by the address generating unit 103 is applied to the address input of the memory 112; the control signal 107 generated by the control-signal generating unit 104 is applied to the control input of the memory 112; and as a result, the data pattern 109, such as a pattern in which all bits are "0"s, is written in an area designated by the address 108. Furthermore, the data pattern 109 generated by the data generating unit 102 is applied to the data input of the memory 112; the address 108 generated by the address generating unit 103 is applied to the address input of the memory 112; the control signal 107 generated by the control-signal generating unit 104 is applied to the control input of the memory 112; the one-hot data 122 generated by the one-hot data generating unit 121 is applied to a bit write enable input of the memory 112; and as a result, the data pattern 109 is written in an area designated by the address 108. In the case of testing the function of the bit write enable circuit of the memory 112, it is possible to configure the one-hot data 122 in such a manner that only one bit of the bit write enable signal is sequentially set to off. In this case, all bits of the data pattern 109 can be set to "1"s.

When the data pattern 109 is written in the memory 112, the BIST control circuit 101 controls the address generating unit 103 and the control-signal generating unit 104, to read out the data pattern 109 that is written in the memory 112 and output the output expected value 110 generated by the data generating unit 102 to the memory-output comparing unit 114. When the data pattern 109 written in the memory 112 is read out, the read data is once stored in the memory-output capture register 113, and then output to the memory-output comparing unit 114. An output from the memory-output capture register 113 and the output expected value 110 are compared with each other in the memory-output comparing unit 114, and the comparison result obtained thus is stored in the flag register 115.

If the i-th bit of the bit write enable signal is normal, because data is not written in the memory 112 for the i-th bit, the read data has a value opposite to the expected value that is written in a previous operation. On the other hand, if there is a fault in the i-th bit of the bit write enable signal, so that data having a value "1" is written despite that a write enable is set to off for the i-th bit, all bits of the read data will be "1"s. Then, the result of comparison with the expected value becomes fail.

In this manner, the BIST circuit 100 can perform the test of the bit write enable circuit, which cannot be thoroughly tested in the marching test and the like, by sequentially comparing the data pattern 109 written in the memory 112 with the output expected value 110 while sequentially setting only the i-th bit of the bit write enable signal to off. As a result, it is possible to enhance quality of the test of the memory 112 while suppressing an increase of the circuit scale.

Figure 2:
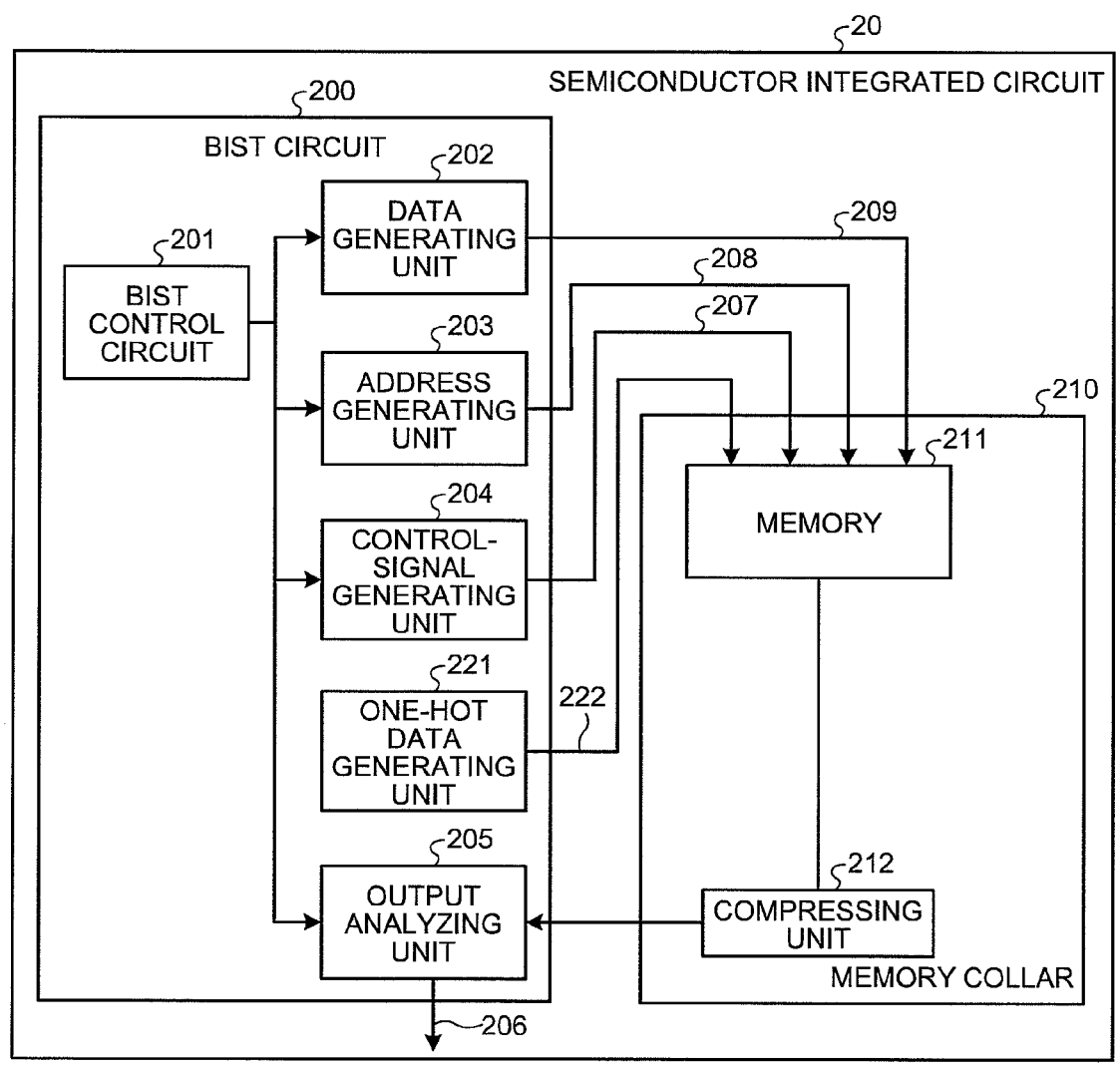
FIG. 2 is a block diagram of a semiconductor integrated circuit according to a second embodiment of the present invention.

FIG. 2 is a block diagram of a semiconductor integrated circuit 20 according to a second embodiment of the present invention.

The semiconductor integrated circuit 20 is formed on a semiconductor chip. As shown in FIG. 2, in the semiconductor integrated circuit 20, a memory collar 210 in which various logical elements necessary for a test operation and a memory 211 are formed and a BIST circuit 200 that tests the memory 211 is incorporated.

The BIST circuit 200 includes a BIST control circuit 201, a data generating unit 202, an address generating unit 203, a control-signal generating unit 204, an output analyzing unit 205, and a one-hot data generating unit 221. The BIST control circuit 201 performs an overall control of the BIST circuit 200; the data generating unit 202 generates a data pattern 209 to be applied to a data input of the memory 211; the address generating unit 203 generates an address 208 of the memory 211 to which the data pattern 209 is applied; the control-signal generating unit 204 generates a control signal 207 for controlling read and write of data with respect to the memory 211; the output analyzing unit 205 generates a BIST result 206; and the one-hot data generating unit 221 generates one-hot data 222 to be applied to an input of the memory 211. The one-hot data 222 can be configured with data for a width of the maximum data bits in which only a state of one bit is inverted with respect to the states of the other bits while sequentially shifting a bit position to be inverted. In the control signal 207, a read enable signal, a write enable signal, a chip enable signal, and the like can be included.

The memory collar 210 includes the memory 211 and a compressing unit 212. The memory 211 stores therein data; and the compressing unit 212 compresses read data that is read from the memory 211.

When performing a failure detection for a cell array, an address decoder, an I/O circuit, and the like in the memory 211, the BIST control circuit 201 controls the data generating unit 202, the address generating unit 203, and the control-signal generating unit 204, to sequentially generate signals required to test the memory 211. The data pattern 209 generated by the data generating unit 202 is applied to the data input of the memory 211; the address 208 generated by the address generating unit 203 is applied to an address input of the memory 211; the control signal 207 generated by the control-signal generating unit 204 is applied to a control input of the memory 211; and as a result, the data pattern 209 is written in an area designated by the address 208.

When the data pattern 209 is written in the memory 211, the BIST control circuit 201 controls the data generating unit 202, the address generating unit 203, and the control-signal generating unit 204, to read out the data pattern 209 that is written in the memory 211. When the data pattern 209 written in the memory 211 is read out, the read data is input to the compressing unit 212 to be sequentially compacted.

If an output expected value is stored in the output analyzing unit 205 as a fixed signal, which is calculated in advance as a test result, compacted data of a final test result stored in the compressing unit 212 and the output expected value are compared with each other in the output analyzing unit 205 at the time of completing the test, and after determining the quality of the memory 211, the BIST result 206 is output to a tester.

On the other hand, if the output expected value is not stored in the output analyzing unit 205, the data stored in the compressing unit 212 is output to a tester at the time of completing the test. After that, the compacted data of the final test result stored in the compressing unit 212 is compared with an output expected value in the tester to determine the quality of the memory 211. In the case of testing a plurality of memories with a single unit of the BIST circuit 200, each of the compressing unit 212 can be connected in series to transfer the compacted data to the output analyzing unit 205.

Meanwhile, in the case of detecting a short defect between wirings connected to the memory 211, the BIST control circuit 201 controls the address generating unit 203, the control-signal generating unit 204, and the one-hot data generating unit 221, to sequentially generate signals required to detect the short defect between the wirings. The one-hot data 222 generated by the one-hot data generating unit 221 is applied to the data input of the memory 211; the address 208 generated by the address generating unit 203 is applied to an address input of the memory 211; the control signal 207 generated by the control-signal generating unit 204 is applied to a control input of the memory 211; and as a result, the one-hot data 222 is written in an area designated by the address 208.

When the one-hot data 222 is written in the memory 211, the BIST control circuit 201 controls the address generating unit 203 and the control-signal generating unit 204, to read out the one-hot data 222 that is written in the memory 211. When the one-hot data 222 written in the memory 211 is read out, the read data is compacted in order and stored in the compressing unit 212. The compacted data of the final test result stored in the compressing unit 212 is output to a tester at the time of completing the test, and the data stored in the compressing unit 212 is compared with an expected value of a compacted value, which makes it possible to detect a short defect between wirings connected to the memory 211.

In the case of testing a function of a bit write enable circuit of the memory 211, the BIST control circuit 201 controls the data generating unit 202, the address generating unit 203, the control-signal generating unit 204, and the one-hot data generating unit 221, to sequentially generate signals required to detect a fault in the bit write enable circuit. The data pattern 209 generated by the data generating unit 202 is applied to the data input of the memory 211; the address 208 generated by the address generating unit 203 is applied to the address input of the memory 211; the control signal 207 generated by the control-signal generating unit 204 is applied to the control input of the memory 211; the one-hot data 222 generated by the one-hot data generating unit 221 is applied to a bit write enable input of the memory 211; and as a result, the data pattern 209 is written in an area designated by the address 208. In the case of testing the function of the bit write enable circuit of the memory 211, it is possible to configure the one-hot data 222 in such a manner that only one bit of the bit write enable signal is sequentially set to off. In this case, all bits of the data pattern 209 can be set to "1"s.

When the data pattern 209 is written in the memory 211, the BIST control circuit 201 controls the data generating unit 202, the address generating unit 203, and the control-signal generating unit 204, to read out the data pattern 209 that is written in the memory 211. When the data pattern 209 written in the memory 211 is read out, the read data is compacted in order and stored in the compressing unit 212. The compacted data of the final test result stored in the compressing unit 212 is output to a tester at the time of completing the test, and the data stored in the compressing unit 212 is compared with an expected value of a compacted value, which makes it possible to test the bit write enable circuit of the memory 211.

Figure 3:
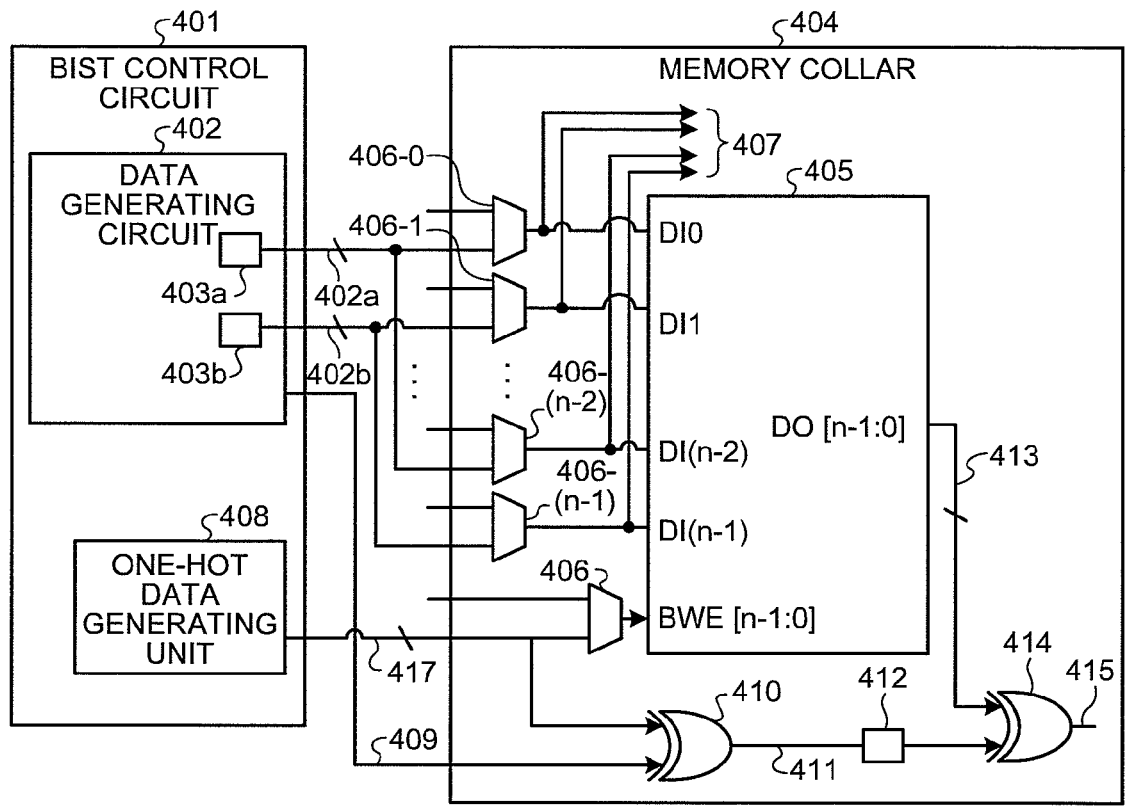
FIG. 3 is a block diagram of a semiconductor integrated circuit according to a third embodiment of the present invention.

FIG. 3 is a block diagram of a semiconductor integrated circuit according to a third embodiment of the present invention. The third embodiment shows a more detailed version of the configuration shown in FIG. 1.

As shown in FIG. 3, the semiconductor integrated circuit according to the third embodiment includes a BIST control circuit 401 and a memory collar 404. The BIST control circuit 401 includes a data generating circuit 402 and a one-hot data generating unit 408. The data generating circuit 402 generates an even-numbered bit data 402a, an odd-numbered bit data 402b, and an output expected value 409; and the one-hot data generating unit 408 generates one-hot data 417. The one-hot data 417 can be configured with data for a width of the maximum data bits in which only a state of one bit is inverted with respect to the states of the other bits while sequentially shifting a bit position to be inverted.

The data generating circuit 402 includes an even-numbered bit data register 403a and an odd-numbered bit data register 403b. The even-numbered bit data register 403a stores therein the even-numbered bit data 402a; and the odd-numbered bit data register 403b stores therein the odd-numbered bit data 402b.

The memory collar 404 includes a memory 405, multiplexers 406, 406-0, 406-1, ..., 406-(n-2), and 406-(n-1), exclusive OR devices 410 and 414, and a timing register 412.

One input terminal of the multiplexer 406 is connected to a logical circuit, and the other input terminal of the multiplexer 406 is connected to the one-hot data generating unit 408, and the output terminal of the multiplexer 406 is connected to a bit write enable input terminal BWE[n-1:0] of the memory 405. One input terminal of each of even-numbered multiplexers 406-0 to 406-(n-2) is connected to a logical circuit, the other input terminal of each of the even-numbered multiplexers 406-0 to 406-(n-2) is connected to the even-numbered bit data register 403a, and the output terminals of the even-numbered multiplexers 406-0 to 406-(n-2) are respectively connected to even-numbered bit data input terminals DI0 to DI(n-2). One input terminal of each of odd-numbered multiplexers 406-1 to 406-(n-1) is connected to a logical circuit, the other input terminal of each of the odd-numbered multiplexers 406-1 to 406-(n-1) is connected to the odd-numbered bit data register 403b, and the output terminals of the odd-numbered multiplexers 406-1 to 406-(n-1) are respectively connected to odd-numbered bit data input terminals DI1 to DI(n-1) of the memory 405. The output terminals of the multiplexers 406-0 to 406-(n-1) are further connected to a bypass path 407 for bypassing the memory 405 and performing a scan test of a logical circuit.

One input terminal of the exclusive OR device 410 is connected to the one-hot data generating unit 408, and the other input terminal of the exclusive OR device 410 is connected to the data generating circuit 402. One input terminal of the exclusive OR device 414 is connected to the output terminal DO[n-1:0] of the memory 405, and the output terminal of the exclusive OR device 410 is connected to the other input terminal of the exclusive OR device 414 via the timing register 412. The timing register 412 is for adjusting a difference between timing cycles of the read data 413 from the memory 405, which is gated at the exclusive OR device 414, and an output expected value 411 of the exclusive OR device 410.

When performing a failure detection for a cell array, an address decoder, an I/O circuit, and the like in the memory 405, the input to each of the multiplexers 406-0 to 406-(n-1) is switched to the data generating circuit 402 side. The data generating circuit 402 generates a data pattern required to test the memory 405, and distributes the data pattern to the even-numbered bit data register 403a and the odd-numbered bit data register 403b such that the same signals are respectively input to the even-numbered bits and the odd-numbered bits of the data input of the memory 405.

The even-numbered bit data 402a distributed to the even-numbered bit data register 403a is input to the even-numbered bit data input terminals DI0 to DI(n-2) of the memory 405 via the even-numbered multiplexers 406-0 to 406-(n-2), and the odd-numbered bit data 402b distributed to the odd-numbered bit data register 403b is input to the odd-numbered bit data input terminals DI1 to DI(n-1) of the memory 405 via the odd-numbered multiplexers 406-1 to 406-(n-1).

By switching the input to each of the multiplexers 406-0 to 406-(n-1) to the logical circuit side, the bypass path 407 can be configured, which only passes the logical circuit, detouring the memory 405 that is treated as a black box at the time of a scan test. This method makes it possible to perform a scan test without passing the memory 405 on both a system logic and the BIST circuit. Although the branch signal to the memory 405 is not included in the scan test, it is possible to detect grade 0 and 1 degeneration faults because the branch signal is activated at the time of executing the BIST.

On the other hand, in the case of testing a function of a bit write enable circuit of the memory 405, the input to the multiplexer 406 is switched to the one-hot data generating unit 408 side. The one-hot data generating unit 408 generates the one-hot data 417 and inputs the one-hot data 417 to the bit write enable input terminal BWE[n-1:0] of the memory 405 via the multiplexer 406.

Hereinafter, it is assumed that the bit write enable signal is set to "enabled" with "0", which is a state allowing a write to the bit, and "disabled" with "1", which is a state of inhibiting a write to the bit.

The data generating circuit 402 sets the even-numbered bit data 402a and the odd-numbered bit data 402b to "1", and inputs the even-numbered bit data 402a and the odd-numbered bit data 402b to the even-numbered bit data input terminals DI0 to DI(n-2) and the odd-numbered bit data input terminals DI1 to DI(n-1) of the memory 405 via the multiplexers 406-0 to 406-(n-1), respectively. When data with all bits "1"s is input to the memory 405, "1" is written in all bits except for the i-th bit corresponding to an invert position for one bit of the one-hot data 417. At the same time, a write is not performed in the i-th bit, and instead, a value "0", which is opposite to a value "1" that is written at the last time, is maintained in the i-th bit.

The write data that is written in the memory 405 is read out via the output terminal DO[n-1:0] and input to the one input terminal of the exclusive OR device 414 by the data bit width of the memory 405. The one-hot data 417 generated by the one-hot data generating unit 408 is input to the one input terminal of the exclusive OR device 410, and the data generating circuit 402 inputs data in which all bits are set to "1"s as the output expected value 409 to the other input terminal of the exclusive OR device 410. When the one-hot data 417 in which only the i-th bit is "1" is input to the exclusive OR device 410, an exclusive OR operation is performed with the output expected value 409. Then, only the i-th bit of the output expected value 409 is inverted, and the output expected value 411 is output to the timing register 412. The output expected value 411 from the exclusive OR device 410 is held for equal to or more than 1 cycle in the timing register 412 to adjust a timing with the read out of data from the memory 405, and then input to the other input terminal of the exclusive OR device 414. Finally, a comparison result signal 415 is generated by performing an exclusive OR operation with the read data from the memory 405 and the output expected value 411 of the exclusive OR device 410, and thus, it is possible to determine whether it is a state in which the i-th bit corresponding to the invert position for the one bit of the one-hot data 417 is maintained without being written with data.

Figure 4:
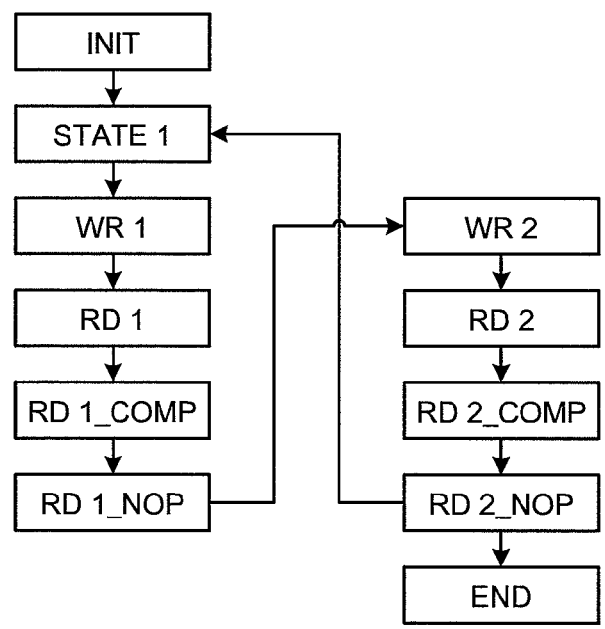
FIG. 4 is a schematic diagram illustrating transition states at the time of a bit write enable test in the semiconductor integrated circuit shown in FIG. 3.
Figure 5:
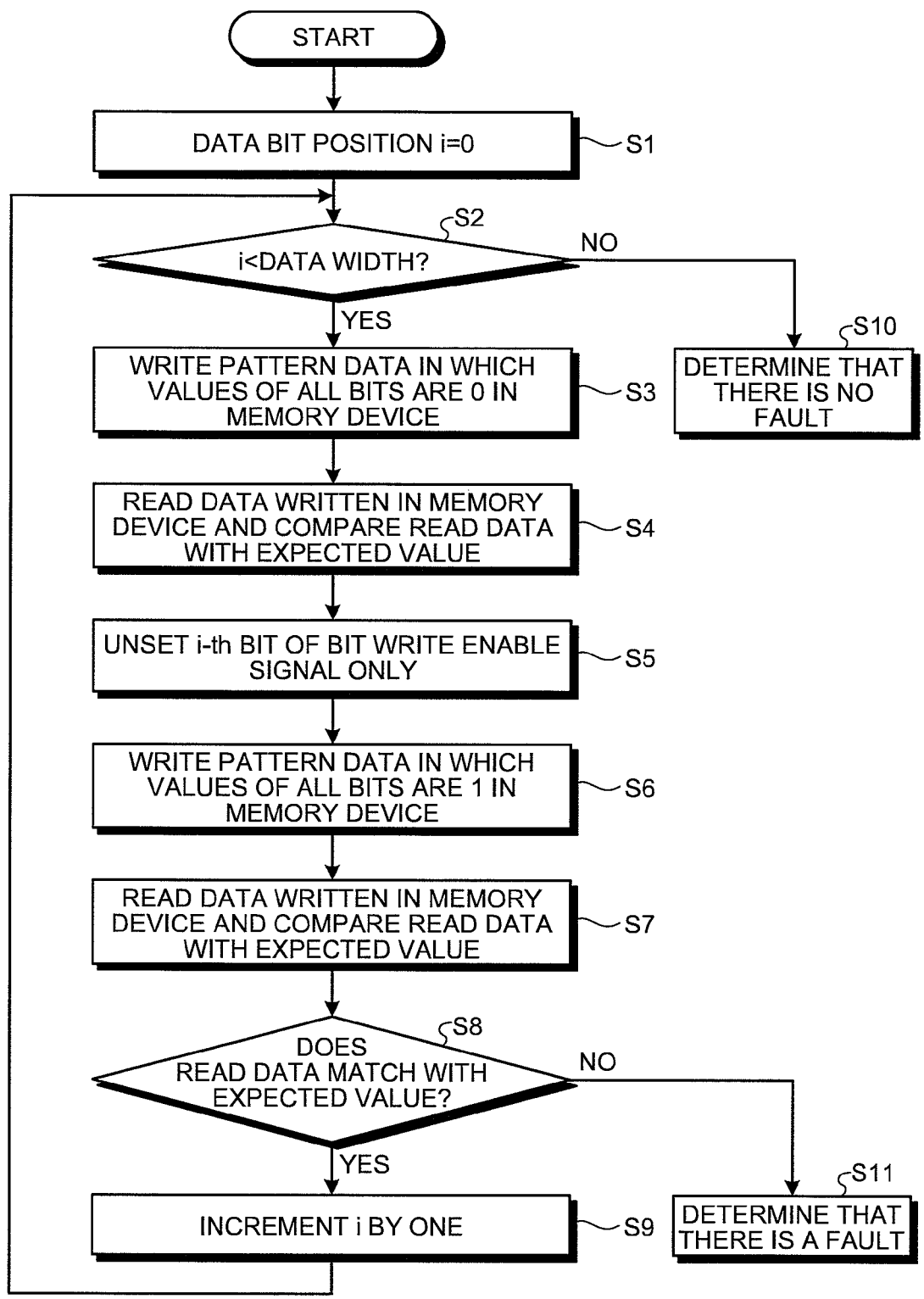
FIG. 5 is a flowchart of an operation at the time of the bit write enable test in the semiconductor integrated circuit shown in FIG. 3.

FIG. 4 is a schematic diagram illustrating transition states at the time of a bit write enable test in the semiconductor integrated circuit shown in FIG. 3; and FIG. 5 is a flowchart of an operation at the time of the bit write enable test in the semiconductor integrated circuit shown in FIG. 3. At the time of the bit write enable test, the address generated in the BIST control circuit 401 shown in FIG. 3 can be fixed, for example, can be set to "0" address.

In FIGS. 4 and 5, at the time of the bit write enable test, the following test sequence is performed according to the transition states shown in FIG. 4.

```
for (i=0;i<data width;i++)   {
    Write   0000....                        (WR1)
    Read    0000.... & compare              (RD1, RD1_COMP)
    Write   1111....   BitWriteEn [i]=OFF   (WR2)
    Read    11.. 0i.. 11 & compare          (RD2, RD2_COMP)
}
```

First, a data bit position i is set (Step S1 in FIG. 5), a data pattern "0000 . . . " in which all bits are "0"s is written in the memory 405 shown in FIG. 3 in the WR1 state shown in FIG. 4 (Step S3 in FIG. 5).

Then, data is read out from the memory 405 in the RD1 state shown in FIG. 4, and is compared with the output expected value 411 in the RD1_COMP state shown in FIG. 4 (Step S4 in FIG. 5).

Only the i-th bit of the bit write enable signal is set to off in the WR2 state shown in FIG. 4 (Step S5 in FIG. 5), and a data pattern "1111 . . . " in which all bits are "1"s is written in the memory 405 (Step S6 in FIG. 5). In this case, if the bit write enable function is working properly, the data "1" is written in the memory 405 except for the i-th bit, and a value "0" that is written at the last time is maintained in the i-th bit. On the other hand, if the bit write enable function is not working properly, the data pattern "1111 . . . " in which all bits are "1"s is written in the memory 405

After that, data is read out from the memory 405 in the RD2 state shown in FIG. 4, and is compared with the output expected value 411 in the RD2_COMP state shown in FIG. 4 (Step S7 in FIG. 5). Then, it is determined whether the read data from the memory 405 and the output expected value 411 match with each other (Step S8 in FIG. 5). The output expected value 409 generated by the data generating circuit 402 is gated with the one-hot data 417 from the one-hot data generating unit 408 at the exclusive OR device 410 shown in FIG. 3, so that only the i-th bit is inverted. Furthermore, the read data from the memory 405 is gated with the output expected value 411 at the exclusive OR device 414, and if normal data is read out from the memory 405, the read data from the memory 405 and the output expected value 411 match with each other, so that all bits of the comparison result signal 415 become "0"s.

On the other hand, if the read data from the memory 405 is not normal, the read data from the memory 405 and the output expected value 411 does not match with each other, and not all bits of the comparison result signal 415 become "0"s, which leads to a determination as faulty (Step S11 in FIG. 5).

The above operations are repeated for all the bit positions i (Steps S2 to S9 in FIG. 5), and if all bits of the comparison result signal 415 are "0"s for all the bit positions i, it is determined that the bit write enable circuit is fault free (Step S10 in FIG. 5). In addition to the case of taking the write data from "0" to "1", the reverse case can be also used in which the write data is taken from "1" to "0".

In this way, it is possible to thoroughly test the function of the bit write enable circuit, which is not possible to thoroughly test in the marching test and the like, with the BIST control circuit 401.

In the third embodiment, a method of testing a single unit of the memory 405 with a single unit of the BIST control circuit 401 is described; however, a configuration can be taken to test a plurality of memories with a single unit of the BIST control circuit 401. In this case, if the memory width is difference memory by memory, it can be configured in such a manner that the write, the read, and the output comparison are skipped for a portion where the data generated by the one-hot data generating unit 408 exceeds the bit width of the memory.

Furthermore, in the third embodiment, a method is explained in which the timing register 412 is incorporated in the memory collar 404; however, a substitute configuration can be taken in which the data generating circuit 402 controls a timing cycle for outputting the output expected value 409.

Figure 6:
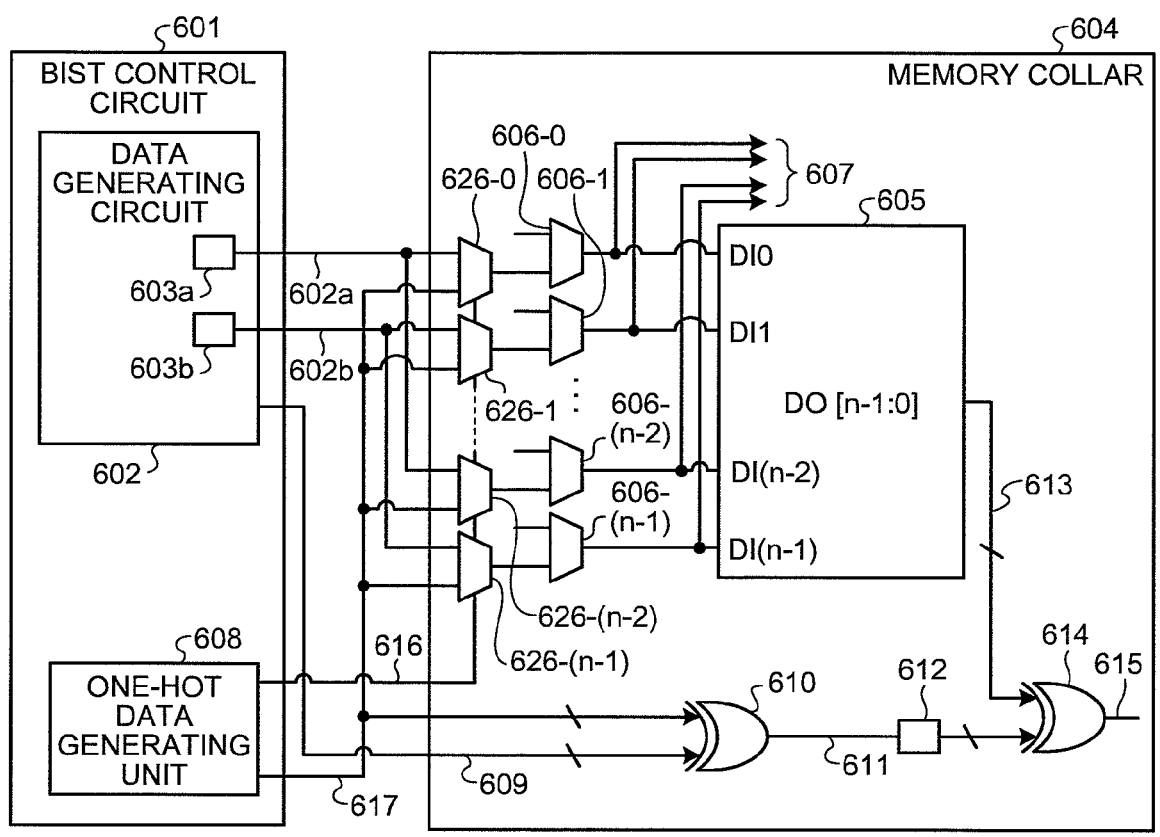
FIG. 6 is a block diagram of a semiconductor integrated circuit according to a fourth embodiment of the present invention.

FIG. 6 is a block diagram of a semiconductor integrated circuit according to a fourth embodiment of the present invention. The fourth embodiment shows another more detailed version of the configuration shown in FIG. 1.

As shown in FIG. 6, the semiconductor integrated circuit according to the fourth embodiment includes a BIST control circuit 601 and a memory collar 604. The BIST control circuit 601 includes a data generating circuit 602 and a one-hot data generating unit 608. The data generating circuit 602 generates an even-numbered bit data 602a, an odd-numbered bit data 602b, and an output expected value 609; and the one-hot data generating unit 608 generates a one-hot mode select signal 616 and one-hot data 617. The one-hot mode select signal 616 can be used to instruct which one of a data pattern generated by the data generating circuit 602 and the one-hot data 617 generated by the one-hot data generating unit 608 is to be input to a data input of a memory 605. The one-hot data 617 can be configured with data for a width of the maximum data bits in which only a state of one bit is inverted with respect to the states of the other bits while sequentially shifting a bit position to be inverted.

The data generating circuit 602 includes an even-numbered bit data register 603a and an odd-numbered bit data register 603b. The even-numbered bit data register 603a stores therein the even-numbered bit data 602a; and the odd-numbered bit data register 603b stores therein the odd-numbered bit data 602b.

The memory collar 604 includes the memory 605, multiplexers 606-0, 606-1, . . . , 606-(n-2), and 606-(n-1) and multiplexers 626-0, 626-1, . . . , 626-(n-2), and 626-(n-1), exclusive OR devices 610 and 614, and a timing register 612.

One input terminal of each of even-numbered multiplexers 626-0 to 626-(n-2) is connected to the even-numbered bit data register 603a, and the other input terminal of each of the even-numbered multiplexers 626-0 to 626-(n-2) is connected to a bit position corresponding to the one-hot data output terminal of the one-hot data generating unit 608. One input terminal of each of odd-numbered multiplexers 626-1 to 626-(n-1) is connected to the odd-numbered bit data register 603b, and the other input terminal of each of the odd-numbered multiplexers 626-1 to 626-(n-1) is connected to a bit position corresponding to the one-hot data output terminal of the one-hot data generating unit 608. A switching control terminal of each of the multiplexers 626-0 to 626-(n-1) is connected to a bit position corresponding to a one-hot mode select signal output terminal of the one-hot data generating unit 608.

One input terminal of each of even-numbered multiplexers 606-0 to 606-(n-2) is connected to a logical circuit, the other input terminal of each of the even-numbered multiplexers 606-0 to 606-(n-2) is connected to the output terminal of each of the even-numbered multiplexers 626-0 to 626-(n-2), and the output terminals of the even-numbered multiplexers 606-0 to 606-(n-2) are respectively connected to even-numbered bit data input terminals DI0 to DI(n-2) of the memory 605. One input terminal of each of odd-numbered multiplexers 606-1 to 606-(n-1) is connected to a logical circuit, the other input terminal of each of the odd-numbered multiplexers 606-1 to 606-(n-1) is connected to the output terminal of each of the odd-numbered multiplexers 626-1 to 626-(n-1), and the output terminals of the odd-numbered multiplexers 606-1 to 606-(n-1) are respectively connected to odd-numbered bit data input terminals DI1 to DI(n-1) of the memory 605. The output terminals of the multiplexers 606-0 to 606-(n-1) are further connected to a bypass path 607 for bypassing the memory 605 and performing a test of a logical circuit.

One input terminal of the exclusive OR device 610 is connected to a bit position corresponding to the one-hot data output terminal of the one-hot data generating unit 608, and the other input terminal of the exclusive OR device 610 is connected to a corresponding bit position of the data generating circuit 602. One input terminal of the exclusive OR device 614 is connected to the output terminal DO[n-1:0] of the memory 605, and the output terminal of the exclusive OR device 610 is connected to the other input terminal of the exclusive OR device 614 via the timing register 612.

When performing a failure detection for a cell array, an address decoder, an I/O circuit, and the like in the memory 605, the input to each of the multiplexers 626-0 to 626-(n-1) is switched to the data generating circuit 602 side, and the input to each of the multiplexers 606-0 to 606-(n-1) is switched to the multiplexers 626-0 to 626-(n-1) side.

The data generating circuit 602 generates a data pattern required to test the memory 605, and distributes the data pattern to the even-numbered bit data register 603a and the odd-numbered bit data register 603b such that the same signals are respectively input to the even-numbered bits and the odd-numbered bits of the data input of the memory 605.

The even-numbered bit data 602a distributed to the even-numbered bit data register 603a is input to the even-numbered bit data input terminals DI0 to DI(n-2) of the memory 605 via the even-numbered multiplexers 626-0 to 626-(n-2) and the even-numbered multiplexers 606-0 to 606-(n-2), and the odd-numbered bit data 602b distributed to the odd-numbered bit data register 603b is input to the odd-numbered bit data input terminals DI1 to DI(n-1) of the memory 605 via the odd-numbered multiplexers 626-1 to 626-(n-1) and the odd-numbered multiplexers 606-1 to 606-(n-1).

One the other hand, in the case of detecting a short defect between wirings connected to the memory 605, the input to each of the multiplexers 626-0 to 626-(n-1) is switched to the one-hot data generating unit 608 side, and the input to each of the multiplexers 606-0 to 606-(n-1) is switched to the multiplexers 626-0 to 626-(n-1) side. The one-hot data generating unit 608 generates the one-hot data 617 and inputs the one-hot data 617 to the even-numbered bit data input terminals DI0 to DI(n-2) and the odd-numbered bit data input terminals DI1 to DI(n-1) of the memory 605 via the multiplexers 626-0 to 626-(n-1) and the multiplexers 606-0 to 606-(n-1). When the one-hot data 617 is input to the memory 605, the one-hot data 617 is sequentially written in the memory 605.

The write data that is written in the memory 605 is read out via the output terminal DO[n-1:0] and input to the one input terminal of the exclusive OR device 614. The one-hot data 617 generated by the one-hot data generating unit 608 is input to the one input terminal of the exclusive OR device 610, and the data generating circuit 602 inputs data in which all bits are set to "0"s as the output expected value 609 to the other input terminal of the exclusive OR device 610. When the one-hot data 617 is input to the exclusive OR device 610, an exclusive OR operation is performed with the output expected value 609, and the one-hot data 617 is output to the timing register 612 as it is as an output expected value 611. The output expected value 611 from the exclusive OR device 610 is held for equal to or more than 1 cycle in the timing register 612 to adjust a timing with the read out of data from the memory 605, and then input to the other input terminal of the exclusive OR device 614. Finally, a comparison result signal 615 is generated by performing an exclusive OR operation with the read data from the memory 605 and the output expected value 611 of the exclusive OR device 610. If the data is written normally, all bits of the comparison result signal 615 become "0"s.

FIG. 7 is a schematic diagram illustrating a change of read data due to a short defect between wirings in the semiconductor integrated circuit according to the fourth embodiment.

As shown in FIG. 7, when only the i-th bit of the one-hot data 617 is inverted, if the i-bit wiring at the input side is not shorted with any wiring other than the i-th bit wiring at the input side, the i-th bit data of the one-hot data 617 is read out from the output terminal DOi as it is. When the exclusive OR operation is performed for each bit of the input and output signals, all bits of the result become "0"s because the data match with each other for every bit between the input and output signals.

On the other hand, if the i-bit wiring at the input side is shorted with any wiring other than the i-th bit wiring at the input side, the state of the i-th bit wiring at the input side becomes "0" in spite that the i-th bit of the one-hot data 617 is "1", and there may be a case in which a fault occurs such that "0" is written in the i-th bit of the memory 605. In this case, "0" is read out from the i-th bit output terminal DOi. When the exclusive OR operation is performed for each bit of the input and output signals, not all bits of the result become "0"s because the data do not match with each other at the i-th bit, which makes it possible to determined that the i-th bit wiring is shorted at the input side.

In the fourth embodiment, a method is explained in which the one-hot mode select signal 616 is generated by the one-hot data generating unit 608; however, a configuration can be taken in which the one-hot mode select signal 616 is input from an external input terminal or internally generated in an automatic manner by a setting of the BIST control circuit 601.

Figure 8:
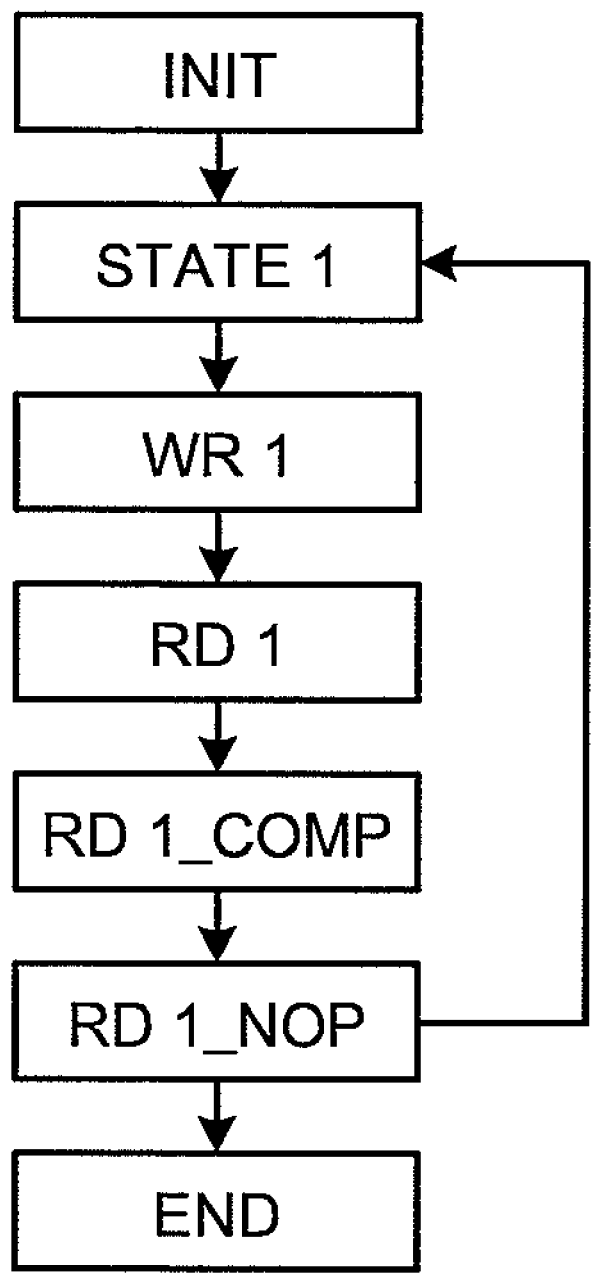
FIG. 8 is a schematic diagram illustrating transition states at the time of a one-hot data test in the semiconductor integrated circuit shown in FIG. 6.
Figure 9:
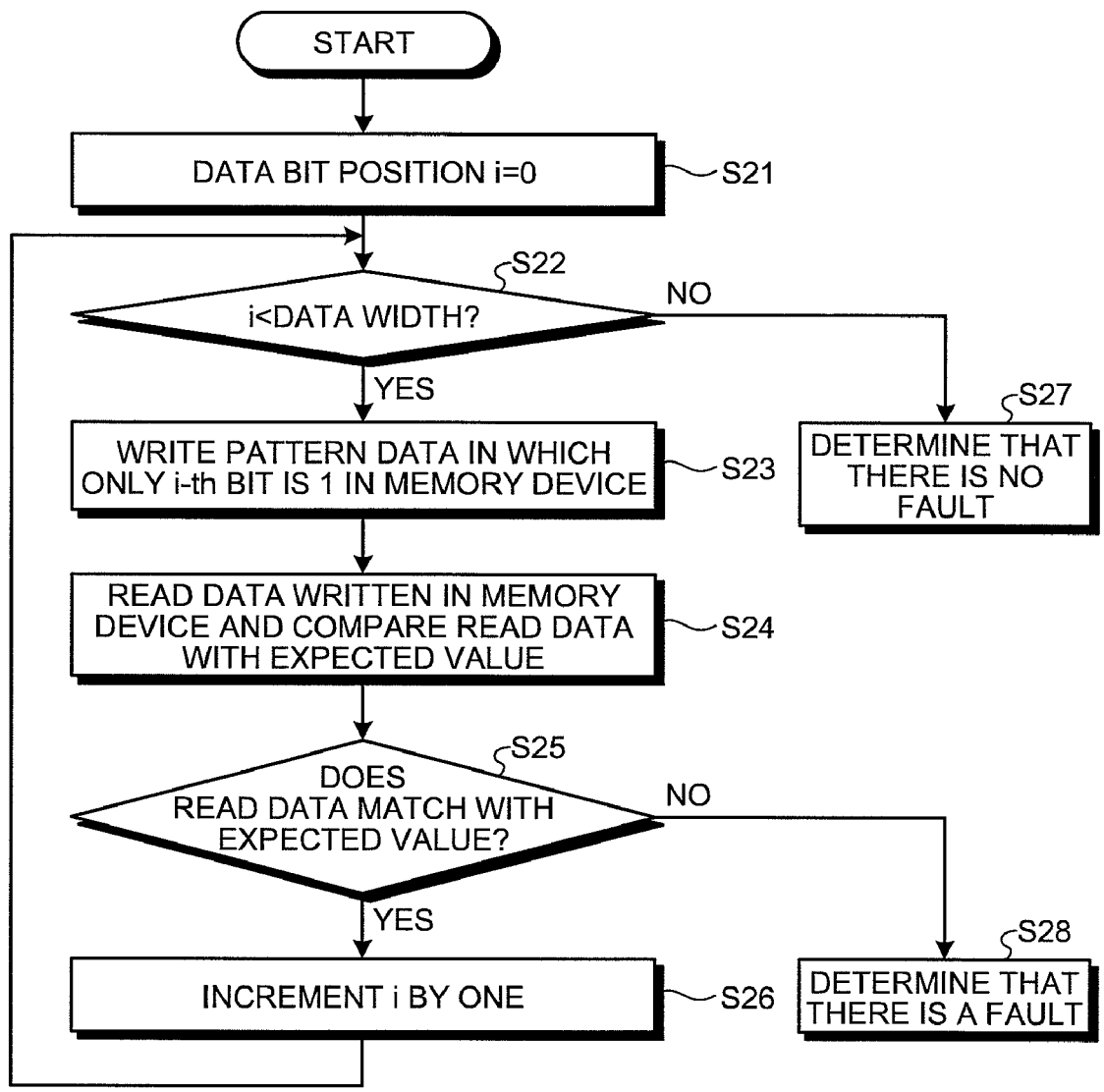
FIG. 9 is a flowchart of an operation at the time of the one-hot data test in the semiconductor integrated circuit shown in FIG. 6.

FIG. 8 is a schematic diagram illustrating transition states at the time of a one-hot data test in the semiconductor integrated circuit shown in FIG. 6; and FIG. 9 is a flowchart of an operation at the time of the one-hot data test in the semiconductor integrated circuit shown in FIG. 6. At the time of the one-hot data test, the address generated in the BIST control circuit 601 shown in FIG. 6 can be fixed, for example, can be set to "0" address.

In FIGS. 8 and 9, at the time of the one-hot data test, the following test sequence is performed according to the transition states shown in FIG. 8.

```
for (i=0;i<data width;i++)    {
    Write   00..01i0...              (WR1)
    Read    00..01i0... & compare    (RD1, RD1_COMP)
}
```

First, a data bit position i is set (Step S21 in FIG. 9), one-hot data "00 . . . 01i0 . . . " in which only the i-th bit is inverted is written in the memory 605 shown in FIG. 6 in the WR1 state shown in FIG. 8 (Step S23 in FIG. 9).

Then, data is read out from the memory 605 in the RD1 state shown in FIG. 8, read data is compared with the output expected value 611 in the RD1_COMP state shown in FIG. 8 (Step S24 in FIG. 9), and it is determined whether the read data from the memory 605 match with the output expected value 611 (Step S25 in FIG. 9). The exclusive OR device 610 can output the one-hot data 617 from the one-hot data generating unit 608 as it is by setting all bits of the output expected value 609 output from the data generating circuit 602 shown in FIG. 6 to "0"s. The read data from the memory 605 is gated with the output expected value 611 at the exclusive OR device 614, and if normal data is read out from the memory 605, the read data from the memory 605 and the output expected value 611 match with each other, so that all bits of the comparison result signal 615 become "0"s.

On the other hand, if the read data from the memory 605 is not normal, the read data from the memory 605 and the output expected value 611 does not match with each other, and not all bits of the comparison result signal 615 become "0"s, which leads to a determination as faulty (Step S28 in FIG. 9).

The above operations are repeated for all the bit positions i (Steps S22 to S26 in FIG. 9), and if all bits of the comparison result signal 615 are "0"s for all the bit positions i, it is determined that the wirings connected to the memory 605 are fault free (Step S27 in FIG. 9). In addition to the case of taking the write data from "0" to "1", the reverse case can be also used in which the write data is taken from "1" to "0".

In this way, it is possible to perform a short defect test between the even-numbered bits or the odd-numbered bits, which is not possible to test in the conventional BIST control circuit, and at the same time, an increase of the test time can be suppressed compared to a method of writing data in a serial manner because the test time is proportional to only the bit width of the memory 605.

In the fourth embodiment, a method of testing a single unit of the memory 605 with a single unit of the BIST control circuit 601 is described; however, a configuration can be taken to test a plurality of memories with a single unit of the BIST control circuit 601.

Figure 10:
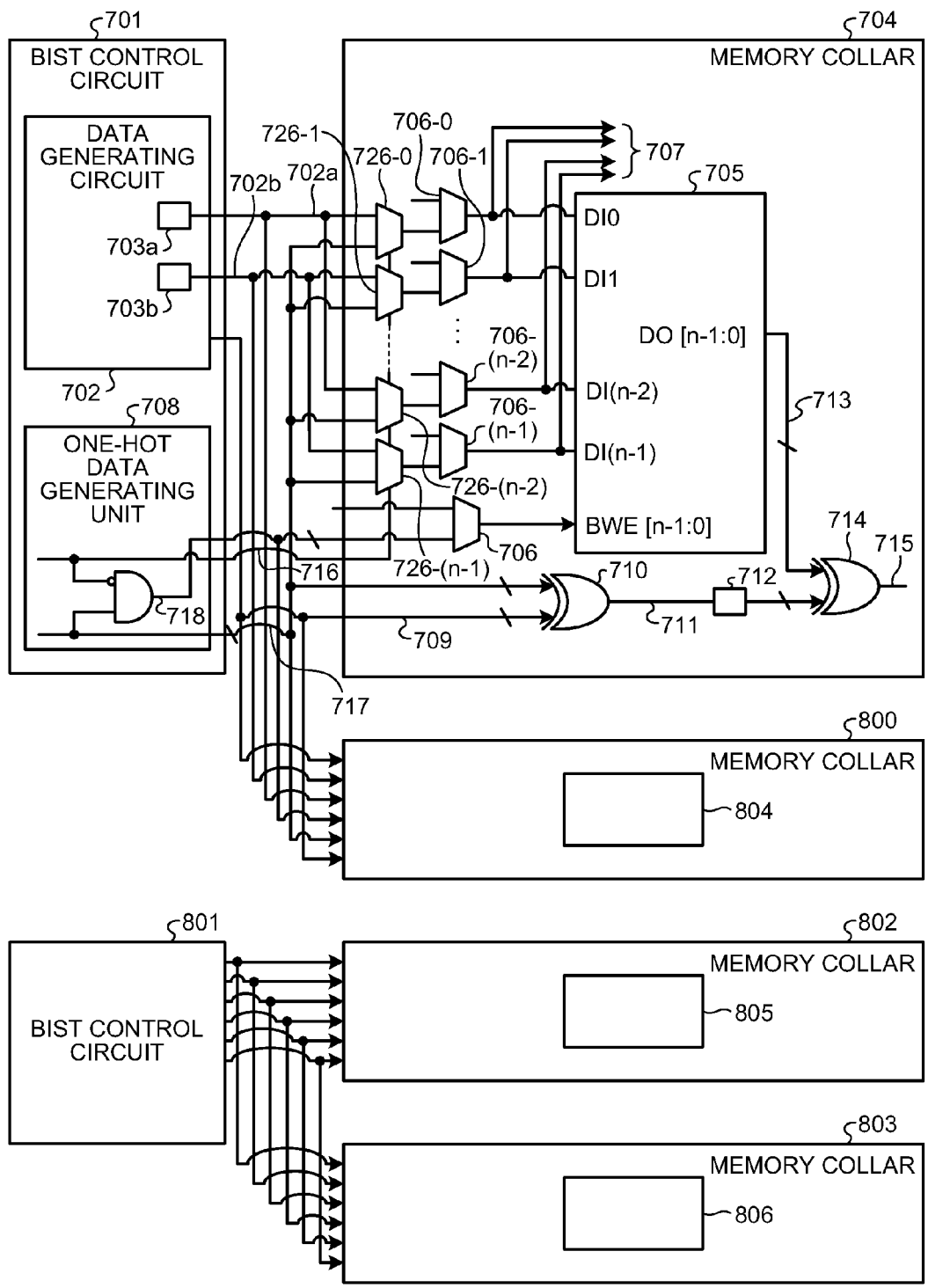
FIG. 10 is a block diagram of a semiconductor integrated circuit according to a fifth embodiment of the present invention.

FIG. 10 is a block diagram of a semiconductor integrated circuit according to a fifth embodiment of the present invention.

As shown in FIG. 10, the semiconductor integrated circuit according to the fifth embodiment includes a BIST control circuit 701 and a memory collar 704. The BIST control circuit 701 includes a data generating circuit 702 and a one-hot data generating unit 708. The data generating circuit 702 generates an even-numbered bit data 702a, an odd-numbered bit data 702b, and an output expected value 709; and the one-hot data generating unit 708 generates a one-hot mode select signal 716 and one-hot data 717. The one-hot mode select signal 716 can be used to instruct which one of a data pattern generated by the data generating circuit 702 and the one-hot data 717 generated by the one-hot data generating unit 708 is to be input to a data input of a memory 705 so that a switching is possible between a bit write enable function test mode and a one-hot data test mode. The one-hot data 717 can be configured with data for a width of the maximum data bits in which only a state of one bit is inverted with respect to the states of the other bits while sequentially shifting a bit position to be inverted.

The data generating circuit 702 includes an even-numbered bit data register 703a and an odd-numbered bit data register 703b. The even-numbered bit data register 703a stores therein the even-numbered bit data 702a; and the odd-numbered bit data register 703b stores therein the odd-numbered bit data 702b. The one-hot data generating unit 708 includes a logical AND device 718 that switches an input of the one-hot data 717 to a bit write enable input terminal BWE[n-1:0] based on the one-hot mode select signal 716.

The memory collar 704 includes the memory 705, multiplexers 706, 706-0, 706-1, . . . , 706-(n-2), and 706-(n-1) and multiplexers 726-0, 726-1, . . . , 726-(n-2), and 726-(n-1), exclusive OR devices 710 and 714, and a timing register 712.

One input terminal of the multiplexer 706 is connected to a logical circuit, the other input terminal of the multiplexer 706 is connected to a bit position corresponding to the output terminal of the logical AND device 718, and the output terminal of the multiplexer 706 is connected to the bit write enable input terminal BWE[n-1:0] of the memory 705. One input terminal of each of even-numbered multiplexers 726-0 to 726-(n-2) is connected to the even-numbered bit data register 703a, and the other input terminal of each of the even-numbered multiplexers 726-0 to 726-(n-2) is connected to a bit position corresponding to the one-hot data output terminal of the one-hot data generating unit 708. One input terminal of each of odd-numbered multiplexers 726-1 to 726-(n-1) is connected to the odd-numbered bit data register 703b, and the other input terminal of each of the odd-numbered multiplexers 726-1 to 726-(n-1) is connected to a bit position corresponding to the one-hot data output terminal of the one-hot data generating unit 708. A switching control terminal of each of the multiplexers 726-0 to 726-(n-1) is connected to a bit position corresponding to a one-hot mode select signal output terminal of the one-hot data generating unit 708.

One input terminal of each of even-numbered multiplexers 706-0 to 706-(n-2) is connected to a logical circuit, the other input terminal of each of the even-numbered multiplexers 706-0 to 706-(n-2) is connected to the output terminal of each of the even-numbered multiplexers 726-0 to 726-(n-2), and the output terminals of the even-numbered multiplexers 706-0 to 706-(n-2) are respectively connected to even-numbered bit data input terminals DI0 to DI(n-2) of the memory 705. One input terminal of each of odd-numbered multiplexers 706-1 to 706-(n-1) is connected to a logical circuit, the other input terminal of each of the odd-numbered multiplexers 706-1 to 706-(n-1) is connected to the output terminal of each of the odd-numbered multiplexers 726-1 to 726-(n-1), and the output terminals of the odd-numbered multiplexers 706-1 to 706-(n-1) are respectively connected to odd-numbered bit data input terminals DI1 to DI(n-1) of the memory 705. The output terminals of the multiplexers 706-0 to 706-(n-1) are further connected to a bypass path 707 for bypassing the memory 705 and performing a scan test of a logical circuit.

One input terminal of the exclusive OR device 710 is connected to a bit position corresponding to the one-hot data output terminal of the one-hot data generating unit 708, and the other input terminal of the exclusive OR device 710 is connected to a corresponding bit position of the data generating circuit 702. One input terminal of the exclusive OR device 714 is connected to the output terminal DO[n-1:0] of the memory 705, and the output terminal of the exclusive OR device 710 is connected to the other input terminal of the exclusive OR device 714 via the timing register 712.

In the case of testing a function of a bit write enable circuit of the memory 705, it is set to the bit write enable function test mode by setting the one-hot mode select signal 716 to "0". When it is set to the bit write enable function test mode, the input to each of the multiplexers 726-0 to 726-(n-1) is switched to the data generating circuit 702 side, and the input to each of the multiplexers 706-0 to 706-(n-1) is switched to the multiplexers 726-0 to 726-(n-1) side. The one-hot data generating unit 708 generates the one-hot data 717, and inputs the one-hot data 717 to the bit write enable input terminal BWE[n-1:0] of the memory 705 via the logical AND device 718 and the multiplexer 706.

In the bit write enable function test mode, because the one-hot mode select signal 716 is "0", the one-hot data 717 is input to the multiplexer 706 as it is with the one-hot mode select signal 716 inverted and input to the logical AND device 718.

The data generating circuit 702 sets the even-numbered bit data 702a and the odd-numbered bit data 702b to "1" and inputs the even-numbered bit data 702a and the odd-numbered bit data 702b to the even-numbered bit data input terminals DI0 to DI(n-2) and the odd-numbered bit data input terminals DI1 to DI(n-1) of the memory 705, respectively, via the multiplexers 706-0 to 706-(n-1). When data with all bits "1"s is input to the memory 705, "1" is written in all bits except for the i-th bit corresponding to an invert position for one bit of the one-hot data 717, and at the same time, a value "0", which is written at the last time, is maintained in the i-th bit.

The write data that is written in the memory 705 is read out via the output terminal DO[n-1:0] and input to the one input terminal of the exclusive OR device 714. The one-hot data 717 generated by the one-hot data generating unit 708 is input to the one input terminal of the exclusive OR device 710, and the data generating circuit 702 inputs data in which all bits are set to "1"s as the output expected value 709 to the other input terminal of the exclusive OR device 710. When the one-hot data 717 is input to the exclusive OR device 710, an exclusive OR operation is performed with the output expected value 709. Then, the one-hot data 717 is inverted, and is output to the timing register 712. The output expected value 711 from the exclusive OR device 710 is held for equal to or more than 1 cycle in the timing register 712 to adjust a timing with the read out of data from the memory 705, and then input to the other input terminal of the exclusive OR device 714. Finally, a comparison result signal 715 is generated by performing an exclusive OR operation with the read data from the memory 705 and the output expected value 711 of the exclusive OR device 710, and thus, it is possible to determine whether data is written normally in the i-th bit corresponding to the invert position for the one bit of the one-hot data 717.

One the other hand, in the case of detecting a short defect between wirings connected to the memory 705, it is set to the one-hot data test mode by setting the one-hot mode select signal 716 to "1". When it is set to the one-hot data test mode, the input to each of multiplexers 726-0 to 726-(n-1) is switched to the one-hot data generating unit 708 side, and the input to each of the multiplexers 706-0 to 706-(n-1) is switched to the multiplexers 726-0 to 726-(n-1) side. The one-hot data generating unit 708 generates the one-hot data 717, and inputs the one-hot data 717 to the even-numbered bit data input terminals DI0 to DI(n-2) and the odd-numbered bit data input terminals DI1 to DI(n-1) of the memory 705 via the multiplexers 726-0 to 726-(n-1) and the multiplexers 706-0 to 706-(n-1).

In the one-hot data test mode, because the one-hot mode select signal 716 is "1", the data output from the logical AND device 718 becomes "0" with the one-hot mode select signal 716 inverted and input to the logical AND device 718. Then, data in which all bits are "0"s is input to the bit write enable input terminal BWE[n-1:0] of the memory 705, and all bits of the memory 705 become write enable states. Therefore, when the one-hot data 717 is input to the memory 705, the one-hot data 717 is sequentially written in the memory 705.

The write data that is written in the memory 705 is read out via the output terminal DO[n-1:0] and input to the one input terminal of the exclusive OR device 714. The one-hot data 717 generated by the one-hot data generating unit 708 is input to the one input terminal of the exclusive OR device 710, and the data generating circuit 702 inputs data in which all bits are set to "0"s as the output expected value 709 to the other input terminal of the exclusive OR device 710. When the one-hot data 717 is input to the exclusive OR device 710, an exclusive OR operation is performed with the output expected value 709, and the one-hot data 717 is output to the timing register 712 as it is as the output expected value 711. The output expected value 711 from the exclusive OR device 710 is held for equal to or more than 1 cycle in the timing register 712 to adjust a timing with the read out of data from the memory 705, and then input to the other input terminal of the exclusive OR device 714. Finally, the comparison result signal 715 is generated by performing an exclusive OR operation with the read data from the memory 705 and the output expected value 711 of the exclusive OR device 710. If the data is written normally, all bits of the comparison result signal 715 become "0"s.

On the other hand, if the i-bit wiring at the input side is shorted with any wiring other than the i-th bit wiring at the input side, the state of the i-th bit wiring at the input side becomes "0" in spite that the i-th bit of the one-hot data 717 is "1", and there may be a case in which a fault occurs such that "0" is written in the i-th bit of the memory 705. In this case, "0" is read out from the i-th bit output terminal DOi. When the exclusive OR operation is performed for each bit of the input and output signals, not all bits of the result become "0"s, which makes it possible to determined that the i-th bit wiring is shorted at the input side. In addition to the case of taking the write data from "0" to "1", the reverse case can be also used in which the write data is taken from "1" to "0".

In this manner, because a bit write enable function test and a one-hot data test of the memory 705 can be performed with a common circuit, it is possible to perform a short defect test among the even-numbered bits or among the odd-numbered bits in addition to a bit write enable function test while suppressing an increase of the circuit scale, and at the same time, an increase of the test time can be suppressed compared to a method of writing data in a serial manner because the test time is proportional to only the bit width of the memory 705.

In the fifth embodiment, a method of testing a single unit of the memory 705 with a single unit of the BIST control circuit 701 is described; however, a plurality of BIST control circuits 701, 801 and a plurality of memory collars 704, 800, 802, 803 may be included, and a configuration can be taken to test a plurality of memories 705, 804 with a single unit of the BIST control circuit 701.

In the case of testing a plurality of memories 705, 804 with a single BIST control circuit 701, if the one-hot data test is simultaneously performed for all of the memories 705, 804, data at the same position may always take the same signal values between different memories 705, 804, and a short defect cannot be determined between these wirings. To cope with this problem, it is possible to perform the one-hot data test for one memory at a time, and write data in which all bits are the same values having non-inverted data for one bit to the other memories. With this scheme, even when performing a test of a plurality of memories 705, 804 with a single BIST control circuit 701, adjacent data bits can always take opposite values without depending on the physical wiring condition, which makes it possible to detect the short defect between these wirings.

In addition, when a plurality of BIST control circuits 701, 801 are installed on a semiconductor integrated circuit, and when each of the BIST control circuits 701, 801 performs a test of a plurality of memories 705, 804-806, it may be the case that the same bit of memories 705, 804-806 that is simultaneously tested by different BIST control circuits 701, 801 always take the same signal values. To cope with this problem, it is possible to select one BIST control circuit for performing the one-hot data test at a time, and even in the selected BIST control circuit, perform the one-hot data test for one memory at a time, and write data in which all bits are the same values having non-inverted data for one bit to the other memories. With this scheme, even when there is a plurality of BIST control circuits 701, 801 performing a test of a plurality of memories 705, 804-806, adjacent data bits can always take opposite values without depending on the physical wiring condition, which makes it possible to detect the short defect between these wirings.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit that includes a built-in self-test circuit for testing a memory, the semiconductor integrated circuit comprising:
   a data generating unit that generates a data pattern to be input to a data input of the memory;
   a control-signal generating unit that generates a control signal for controlling read and write of data with respect to the memory; and
   a one-hot data generating unit that generates one-hot data for a predetermined bit width in which a state of one bit is exclusively inverted with respect to states of other bits, and inputs the one-hot data to the data input or a bit write enable input of the memory, while sequentially shifting a bit position to be inverted;

an address generating unit that generates an address of the memory to which the data pattern or the one-hot data is to be input; wherein the built-in self-test circuit has a first test mode and a second test mode, in the first test mode, the one-hot data generated by the one-hot data unit are input to a bit write enable input of the memory, while the data pattern generated by the data generating unit are input to the data input of the memory so as to write the data pattern in an area designated by the address, the data pattern written to the memory is compared with the data pattern read from the memory each time one bit of the one-hot data is exclusively inverted while the address is fixed, and in the second test mode, the one-hot data generated by the one-hot data unit are input to the data input of the memory so as to write the one-hot data in an area designated by the address, while the data pattern generated by the data generating unit are inhibited from inputting to the data input of the memory, the one-hot data written to the memory is compared with the one-hot data read from the memory each time one bit of the one-hot data is exclusively inverted while the address is fixed.

2. The semiconductor integrated circuit according to claim 1, wherein the memory includes a plurality of memories to be tested by a single built-in self-test circuit, and in the second test mode, the built-in self-test circuit selects the memories one by one, controls the one-hot data to be input to a data input of a selected memory, and inputs a data pattern in which data for one bit of the one-hot data is not inverted to data inputs of other memories.

3. The semiconductor integrated circuit according to claim 1, wherein the built-in self-test circuit includes a plurality of built-in self-test circuits each performing a test of a plurality of memories, and in the second test mode, each of the built-in self-test circuits selects one memory, controls the one-hot data to be input to a data input of a selected memory, and inputs a data pattern in which data for one bit of the one-hot data is not inverted to data inputs of other memories.

4. The semiconductor integrated circuit according to claim 2, wherein the predetermined bit width of the one-hot data is a maximum data bit width of a plurality of memories to be tested.

5. A semiconductor integrated circuit comprising:

a memory collar that includes a memory to be tested and a logical element necessary for a test operation of the memory;

a data generating unit that generates a data pattern to be input to a data input of the memory; and an address generating unit that generates an address of the memory to which the data pattern is to be input;

a one-hot data generating unit that generates one-hot data for a predetermined bit width in which a state of one bit is exclusively inverted with respect to states of other bits while sequentially shifting a bit position to be inverted, and inputs the one-hot data to a bit write enable input of the memory, while sequentially shifting a bit position to be inverted, wherein the one-hot data generated by the one-hot data unit are input to a bit write enable input of the memory, while the data pattern generated by the data generating unit are input to the data input of the memory so as to write the data pattern in an area designated by the address, and the data pattern written to the memory is compared with the data pattern read from the memory each time one bit of the one-hot data is exclusively inverted while the address is fixed.

6. The semiconductor integrated circuit according to claim 5, wherein the data generating unit inputs the data pattern in which all bits are "0"s to the data input of the memory, and then, inputs the data pattern in which all bits are "1" to the data input of the memory while the one-hot data is input to the bit write enable input of the memory, and the logical element performs a manufacturing test of the memory by determining whether read data that is read out from the memory match with an output expected value that is obtained in advance.

7. The semiconductor integrated circuit according to claim 5, wherein the data generating unit includes an even-numbered bit data register that stores therein even-numbered bit data to be input to an even-numbered bit data input terminal of the memory; and an odd-numbered bit data register that stores therein odd-numbered bit data to be input to an odd-numbered bit data input terminal of the memory.

8. The semiconductor integrated circuit according to claim 7, further comprising:

a multiplexer that selects one of the even-numbered bit data, the odd-numbered bit data, and data from a logical circuit, and inputs selected data to a data input terminal of the memory.

9. A semiconductor integrated circuit comprising:

a memory collar that includes a memory to be tested and a logical element necessary for a test operation of the memory;

a data generating unit that generates a data pattern to be applied to a data input of the memory; and a one-hot data generating unit that generates one-hot data for a predetermined bit width in which a state of one bit is exclusively inverted with respect to states of other bits while sequentially shifting a bit position to be inverted, and sequentially applies the one-hot data to a data input of the memory while inhibiting the data pattern generated by the data generating unit from being input to the data input of the memory; and an address generating unit that generates a address of the memory to which the one-hot data is to be input, wherein the one-hot data written to the memory is compared with the one-hot data read from the memory each time one bit of the one-hot data is exclusively inverted while the address is fixed.

10. The semiconductor integrated circuit according to claim 9, wherein the data generating unit includes an even-numbered bit data register that stores therein even-numbered bit data to be input to an even-numbered bit data input terminal of the memory; and an odd-numbered bit data register that stores therein odd-numbered bit data to be input to an odd-numbered bit data input terminal of the memory.

11. The semiconductor integrated circuit according to claim 10, further comprising:
   a first multiplexer that selects one of the even-numbered bit data, the odd-numbered bit data, and the one-hot data, and outputs selected data; and
   a second multiplexer that selects either one of an output of the first multiplexer and data from a logical circuit, and inputs selected data to a data input terminal of the memory.

* * * * *